(12) United States Patent
Murata (10) Patent No.: US 9,072,197 B2
(45) Date of Patent: Jun. 30, 2015

(54) COOLING APPARATUS

(75) Inventor: Takahito Murata, Toyokawa (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 168 days.

(21) Appl. No.: 14/001,086

(22) PCT Filed: Mar. 10, 2011

(86) PCT No.: PCT/JP2011/055589
§ 371 (c)(1),
(2), (4) Date: Aug. 22, 2013

(87) PCT Pub. No.: WO2012/120672
PCT Pub. Date: Sep. 13, 2012

(65) Prior Publication Data
US 2013/0335920 A1    Dec. 19, 2013

(51) Int. Cl.
*H05K 7/20* (2006.01)
*H01L 25/11* (2006.01)
*H01L 23/473* (2006.01)
*H01L 23/051* (2006.01)
*H01L 23/00* (2006.01)

(52) U.S. Cl.
CPC .......... *H05K 7/20236* (2013.01); *H01L 25/112* (2013.01); *H01L 23/473* (2013.01); *H01L 2224/40137* (2013.01); *H01L 23/051* (2013.01); *H01L 24/29* (2013.01); *H01L 24/32* (2013.01); *H01L 24/33* (2013.01); *H05K 7/20636* (2013.01); *H05K 7/2089* (2013.01); *H01L 2224/291* (2013.01); *H01L 2224/32245* (2013.01); *H01L 2224/33181* (2013.01)

(58) Field of Classification Search
CPC ... H05K 7/20; H05K 7/2089; H05K 7/20763; H05K 7/20281; H01L 23/34; H01L 23/473; H01L 23/36; H01L 23/4012; G06F 1/20; F28F 7/00
USPC .......... 361/679.46, 679.53, 679.54, 688, 689, 361/698–702, 715, 719, 722–724; 165/80.2, 80.4, 80.5, 104.19, 104.21, 165/104.22, 104.33; 62/3.2, 3.3, 3.7, 259.2; 257/713, 714, 718, 719; 174/15.1, 16.3
See application file for complete search history.

(56) References Cited

U.S. PATENT DOCUMENTS

| | | | |
|---|---|---|---|
| 4,984,066 A * | 1/1991 | Iversen | 257/714 |
| 5,003,376 A * | 3/1991 | Iversen | 257/714 |
| 5,380,956 A * | 1/1995 | Loo et al. | 174/252 |
| 5,737,186 A * | 4/1998 | Fuesser et al. | 361/699 |
| 6,717,812 B1 * | 4/2004 | Pinjala et al. | 361/699 |
| 7,829,994 B2 * | 11/2010 | Conn | 257/686 |
| 8,125,781 B2 * | 2/2012 | Mamitsu et al. | 361/702 |
| 8,363,402 B2 * | 1/2013 | Brunschwiler et al. | 361/699 |

(Continued)

FOREIGN PATENT DOCUMENTS

| | | |
|---|---|---|
| JP | 042156 | 1/1992 |
| JP | 2001308266 | 11/2001 |

(Continued)

*Primary Examiner* — Michail V Datskovskiy
(74) *Attorney, Agent, or Firm* — Sughrue Mion, PLLC (57) ABSTRACT

A cooling apparatus includes a case in which a refrigerant passage through which a refrigerant flows is formed inside, and an element module partially disposed within the refrigerant passage and including an element provided inside. A portion of the element module in contact with the refrigerant is formed of an insulating material.

9 Claims, 9 Drawing Sheets

(56) References Cited

U.S. PATENT DOCUMENTS

| | | | |
|---|---|---|---|
| 8,363,403 B2 * | 1/2013 | Tonomoto | 361/699 |
| 2003/0067748 A1 | 4/2003 | Tamba et al. | |
| 2004/0061138 A1 | 4/2004 | Shinohara et al. | |
| 2006/0096299 A1 * | 5/2006 | Mamitsu et al. | 62/3.2 |
| 2006/0219396 A1 | 10/2006 | Abei et al. | |
| 2007/0044952 A1 | 3/2007 | Kuno et al. | |
| 2008/0277104 A1 | 11/2008 | Aoki et al. | |
| 2010/0139997 A1 | 6/2010 | Nakamura et al. | |
| 2010/0182747 A1 | 7/2010 | Yoshida et al. | |
| 2011/0316142 A1 * | 12/2011 | Noritake et al. | 257/713 |

FOREIGN PATENT DOCUMENTS

| | | |
|---|---|---|
| JP | 2004-119667 A | 4/2004 |
| JP | 2004-363337 A | 12/2004 |
| JP | 2005-057212 A | 3/2005 |
| JP | 2005-191527 A | 7/2005 |
| JP | 2005191082 | 7/2005 |
| JP | 2006-166604 A | 6/2006 |
| JP | 2006156624 | 6/2006 |
| JP | 2006165534 | 6/2006 |
| JP | 2006-210605 A | 8/2006 |
| JP | 2006287108 | 10/2006 |
| JP | 2006-339239 A | 12/2006 |
| JP | 2007-043204 A | 2/2007 |
| JP | 2008-283067 A | 11/2008 |
| JP | 2008-311496 A | 12/2008 |
| JP | 2010-177529 A | 8/2010 |
| WO | 0163666 A1 | 8/2001 |

* cited by examiner

COOLING APPARATUS

CROSS REFERENCE TO RELATED APPLICATIONS

This application is a National Stage of International Application No. PCT/JP2011/055589 filed Mar. 10, 2011, the contents of all of which are incorporated herein by reference in their entirety.

TECHNICAL FIELD

The present invention relates to a cooling apparatus, and particularly to a cooling apparatus in which an element module is disposed within a refrigerant passage.

BACKGROUND ART

Various types of cooling apparatuses for cooling elements have been conventionally proposed.

The semiconductor device described in Japanese Patent Laying-Open No. 2006-339239, for example, includes a semiconductor module containing a heat generating element and a cooling jacket holding a refrigerant therein. The refrigerant is an insulating material, and the heat generating element is directly immersed in the refrigerant.

The cooling jacket is provided with a pump for forced circulation of the refrigerant in the cooling jacket, and a heat exchanger for cooling the refrigerant. The heat exchanger for cooling the refrigerant in the cooling jacket is formed such that radiator coolant or a refrigerant for an air conditioner of an automobile circulates therein.

The semiconductor element described in Japanese Patent Laying-Open No. 2010-177529 includes a heat sink for cooling a transistor, wherein the transistor is mounted on the heat sink.

The power converting apparatus described in Japanese Patent Laying-Open No. 2006-166604 includes a water passage cover, and a power semiconductor module provided on the water passage cover, wherein a liquid coolant circulates in the water passage cover.

The immersed-type double-sided heat radiating power module described in Japanese Patent Laying-Open No. 2005-57212 includes a power element, a first electrode joined to one surface of the power element, a second electrode joined to the other surface of the power element with a heat sink interposed therebetween, a third electrode joined to the power element through a wire, and a box-like package.

The power element, the first, second, and third electrodes, and the heat sink are housed within the package, and the first, second, and third electrodes are in close contact with an inner surface of the package with a thermally conductive insulating layer interposed therebetween. Moreover, part of the space inside the package other than the part in which the power element is located is charged with a sealant made of a silicone gel, an epoxy resin, or the like.

The cooling apparatus described in Japanese Patent Laying-Open No. 2008-283067 includes cooling pipes provided on opposing main surfaces of a semiconductor module.

The stacked-type cooling apparatus described in Japanese Patent Laying-Open No. 2005-191527 includes cooling pipes disposed on opposing surfaces of an electronic component.

CITATION LIST

Patent Document

PTD 1: Japanese Patent Laying-Open No. 2006-339239
PTD 2: Japanese Patent Laying-Open No. 2010-177529
PTD 3: Japanese Patent Laying-Open No. 2006-166604
PTD 4: Japanese Patent Laying-Open No. 2005-57212
PTD 5: Japanese Patent Laying-Open No. 2008-283067
PTD 6: Japanese Patent Laying-Open No. 2005-191527

SUMMARY OF INVENTION

Technical Problem

The semiconductor device described in Japanese Patent Laying-Open No. 2006-339239 has a problem in that since an electrode of the heat generating element is in direct contact with the refrigerant, no refrigerant other than an insulating refrigerant can be adopted.

In the semiconductor element described in Japanese Patent Laying-Open No. 2010-177529, since the transistor is disposed on the heat sink, the cooling efficiency is lower than a case where the transistor is immersed in a refrigerant.

Similarly, in the power converting apparatus described in Japanese Patent Laying-Open No. 2006-166604, the power semiconductor module is not immersed in the liquid coolant, so that the cooling efficiency is lower than a case where the power semiconductor module is immersed in the liquid coolant.

In the immersed-type double-sided heat radiating power module described in Japanese Patent Laying-Open No. 2005-57212, the package in contact with the coolant water is not formed of an insulating material. It is thus necessary to adopt a thermally conductive insulating layer with a large film thickness, or increase the distance between the power element and an inner wall surface of the package. Consequently, the size of the heat radiating module increases.

In the cooling apparatus described in Japanese Patent Laying-Open No. 2008-283067, the semiconductor module disposed between the cooling pipes and the cooling pipes have thermal expansion coefficients different from each other, so that the semiconductor module may be damaged if it is heated to an elevated temperature. On the other hand, if a gap is formed between the semiconductor module and each cooling pipe, the cooling efficiency of the semiconductor module significantly decreases.

A similar problem to that with the above-described cooling apparatus also occurs in the stacked-type cooling apparatus described in Japanese Patent Laying-Open No. 2005-191527.

The present invention was made in view of the problems as described above, and an object of the invention is to provide a cooling apparatus that can adopt various types of refrigerants, and is also small in size and exhibits high cooling performance.

Solution to Problem

A cooling apparatus according to the present invention includes a case in which a refrigerant passage through which a refrigerant flows is formed, and an element module partially disposed within the refrigerant passage and including an element provided inside. A portion of the element module in contact with the refrigerant is formed of an insulating material. The element includes a first unit element and a second unit element that generates an amount of heat greater than that generated by the first unit element. A distance between the second unit element and an inner wall surface of the refrigerant passage is smaller than a distance between the first unit element and the inner wall surface of the refrigerant passage.

Preferably, the element module includes a first insulating substrate in contact with the refrigerant, a second insulating substrate facing the first insulating substrate and disposed at a distance from the first insulating substrate, and being in contact with the refrigerant, and a resin portion charged between the first insulating substrate and the second insulating substrate and formed of an insulating material. The element is provided between the first insulating substrate and the second insulating substrate, and disposed within the resin portion.

Preferably, the first insulating substrate includes a first inner surface facing the second insulating substrate, and a first outer surface positioned opposite to the second insulating substrate with respect to the first inner surface. The second insulating substrate includes a second inner surface facing the first insulating substrate, and a second outer surface positioned opposite to the first insulating substrate with respect to the second inner surface. The resin portion reaches the first outer surface and the second outer surface from a portion between the first insulating substrate and the second insulating substrate, and is formed to cover a portion of the second outer surface. A first cooling surface uncovered by the resin portion and in contact with the refrigerant is formed on the first outer surface. A second cooling surface uncovered by the resin portion and in contact with the refrigerant is formed on the second outer surface. When the first insulating substrate, the second insulating substrate, and the element are seen in a direction in which the first insulating substrate and the second insulating substrate are arranged, the element is disposed within the first cooling surface and the second cooling surface.

Preferably, the resin portion is formed from the portion between the first insulating substrate and the second insulating substrate toward portions of the first outer surface and the second outer surface, and is formed to cover the portions of the first outer surface and the second outer surface, and includes an edge extending along outer peripheries of the first insulating substrate and the second insulating substrate. The first cooling surface is formed on a portion of the first outer surface uncovered by the edge, and the second cooling surface is formed on a portion of the second outer surface uncovered by the edge. A receiving portion that receives a portion of the edge is formed on an inner surface of the refrigerant passage.

Preferably, the first insulating substrate includes a plurality of first cooling fins protruding from the first cooling surface. The second insulating substrate includes a plurality of second cooling fins protruding from the second cooling surface. Preferably, the first insulating substrate and the second insulating substrate are formed of a ceramic. Preferably, the first insulating substrate includes a first inner surface facing the second insulating substrate, and a first outer surface positioned opposite to the second insulating substrate with respect to the first inner surface. The second insulating substrate includes a second inner surface facing the first insulating substrate, and a second outer surface positioned opposite to the first insulating substrate with respect to the second inner surface. The first unit element is provided in a position closer to the first inner surface than the second inner surface, and the second unit element is provided in a position closer to the second inner surface than the first inner surface.

A distance between the second outer surface and an inner wall surface of the refrigerant passage is smaller than a distance between the first outer surface and the inner wall surface of the refrigerant passage. Preferably, at least one of a plurality of depressions or a plurality of projections are formed on an inner surface of the refrigerant passage. Preferably, the case is integrally formed by resin molding.

Advantageous Effects of Invention

The cooling apparatus according to the present invention can adopt various types of refrigerants, and is also small in size and exhibits high cooling efficiency.

DESCRIPTION OF EMBODIMENTS

Embodiments of the present invention will be described hereinafter. Note that identical or corresponding parts are denoted by identical reference signs, and description thereof may not be repeated. Moreover, in the below-described embodiments, unless otherwise stated, when reference is made to a number, an amount, or the like, the scope of the present invention is not necessarily limited to that number, amount, or the like. Furthermore, unless otherwise stated, where there are a plurality of embodiments hereinbelow, it is originally intended to combine features of the various embodiments, as appropriate.

Figure 1:
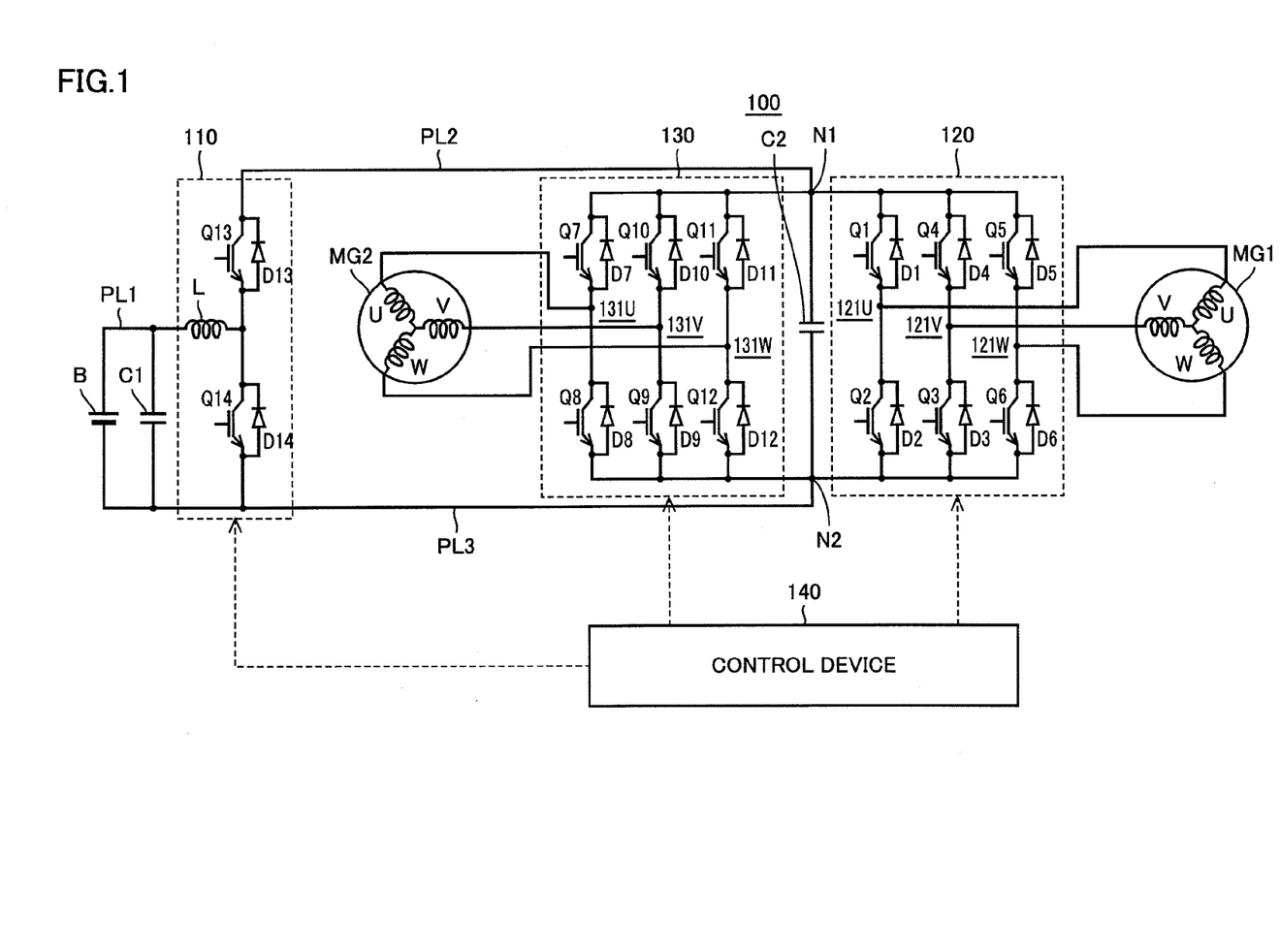
FIG. 1 is a circuit diagram showing the configuration of main portions of a PCU to which the cooling apparatus for a semiconductor element according to one embodiment of the present invention is applied.

FIG. 1 is a circuit diagram showing the configuration of main portions of a PCU to which the cooling apparatus for a semiconductor element according to one embodiment of the present invention is applied. It is noted that PCU 100 shown in FIG. 1 represents a "control device for a rotating electric machine that drives a vehicle".

Referring to FIG. 1, PCU 100 includes a converter 110, inverters 120, 130, a control device 140, and capacitors C1, C2. Converter 110 is connected between a battery B, and inverters 120, 130, and inverters 120, 130 are connected to motor generators MG1, MG2, respectively.

Converter 110 includes power transistors Q13, Q14, diodes D13, D14, and a reactor L. Power transistors Q13, Q14 are connected in series, and each power transistor receives a control signal from control device 140 at its base. Diodes D13, D14 are connected between the collector and the emitter of power transistors Q13 and Q14, respectively, so as to allow current to flow from the emitter toward the collector of power transistors Q13 and Q14, respectively. A reactor L has its one end connected to a power supply line PL1, which is connected to a positive electrode of battery B, and its other end connected to a connection point between power transistors Q13 and Q14.

Converter 110 boosts a DC voltage received from battery B using reactor L, and supplies the boosted voltage to a power supply line PL2. Converter 110 reduces the DC voltage received from inverters 120, 130, and charges battery B.

Inverters 120, 130 include U-phase arms 121U, 131U, V-phase arms 121V, 131V, and W-phase arms 121W, 131W. U-phase arm 121U, V-phase arm 121V, and W-phase arm 121W are connected in parallel between a node N1 and a node N2. Similarly, U-phase arm 131U, V-phase arm 131V, and W-phase arm 131W are connected in parallel between node N1 and node N2.

U-phase arm 121U includes two power transistors Q1, Q2 connected in series. Similarly, each of U-phase arm 131U, V-phase arms 121V, 131V, and W-phase arms 121W, 131W includes two of power transistors Q3 to Q12 connected in series. Diodes D3 to D12 are connected between the collector and the emitter of power transistors Q3 to Q12, respectively, so as to allow current to flow from the emitter toward the collector.

An intermediate point of the arm of each phase of inverters 120, 130 is connected to an end of each phase of the coil of each phase of motor generators MG1, MG2, respectively. Motor generators MG1, MG2 are configured such that one ends of the three coils of the U-, V- and W-phases are connected in common to the intermediate point.

Capacitor C1 is connected across power source lines PL1 and PL3 to smooth the voltage level of power source line PL1. Capacitor C2 is connected across power source lines PL2 and PL3 to smooth the voltage level of power source line PL2.

Inverters 120, 130 convert a DC voltage from capacitor C2 to an AC voltage based on a driving signal from control device 140 to drive motor generators MG1, MG2.

Control device 140 calculates a voltage of the coil of each phase of motor generators MG1, MG2 based on a motor torque command value, a current value of each phase of motor generators MG1, MG2, and input voltages of inverters 120, 130, and, based on the calculation result, generates a PWM (Pulse Width Modulation) signal for turning on/off power transistors Q1 to Q11, and outputs the signal to inverters 120, 130.

Control device 140 also calculates a duty ratio of power transistors Q12, Q13 for optimizing the input voltages of inverters 120, 130 based on the above-mentioned motor torque command value and a motor speed, and based on the calculation result, generates a PWM signal for turning on/off power transistors Q12, Q13, and outputs the signal to converter 110.

Furthermore, control device 140 controls the switching operation of power transistors Q1 to Q14 in converter 110 and inverters 120, 130, in order to convert AC electric power generated by motor generators MG1, MG2 to DC electric power for charging battery B.

During operation of PCU 100, heat is generated by power transistors Q1 to Q14 and diodes D1 to D14 that constitute converter 110 and inverters 120, 130. It is thus necessary to provide a cooling apparatus for promoting cooling of these semiconductor elements.

Figure 2:
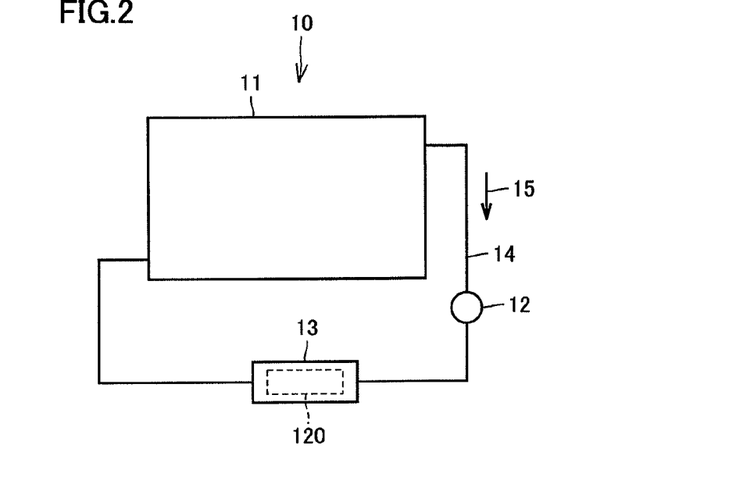
FIG. 2 is a circuit diagram schematically showing a cooling circuit 10 that cools an inverter 120.

FIG. 2 is a circuit diagram schematically showing cooling circuit 10 that cools inverter 120. As shown in FIG. 2, cooling circuit 10 includes a heat exchanger 11 provided in a radiator of a vehicle, a pump 12, a cooling apparatus 13, and a refrigerant pipe 14 in which a refrigerant 15 flows inside.

Refrigerant pipe 14 connects between heat exchanger 11 and pump 12, between pump 12 and cooling apparatus 13, and between cooler 13 and heat exchanger 11.

Heat exchanger 11 cools refrigerant 15 using ambient air. The cooled refrigerant 15 is supplied to cooling apparatus 13 with pump 12, and cooling apparatus 13 cools each element of inverter 120 provided inside. Refrigerant 15 discharged from cooling apparatus 13 is supplied to heat exchanger 11 and cooled therein.

Figure 3:
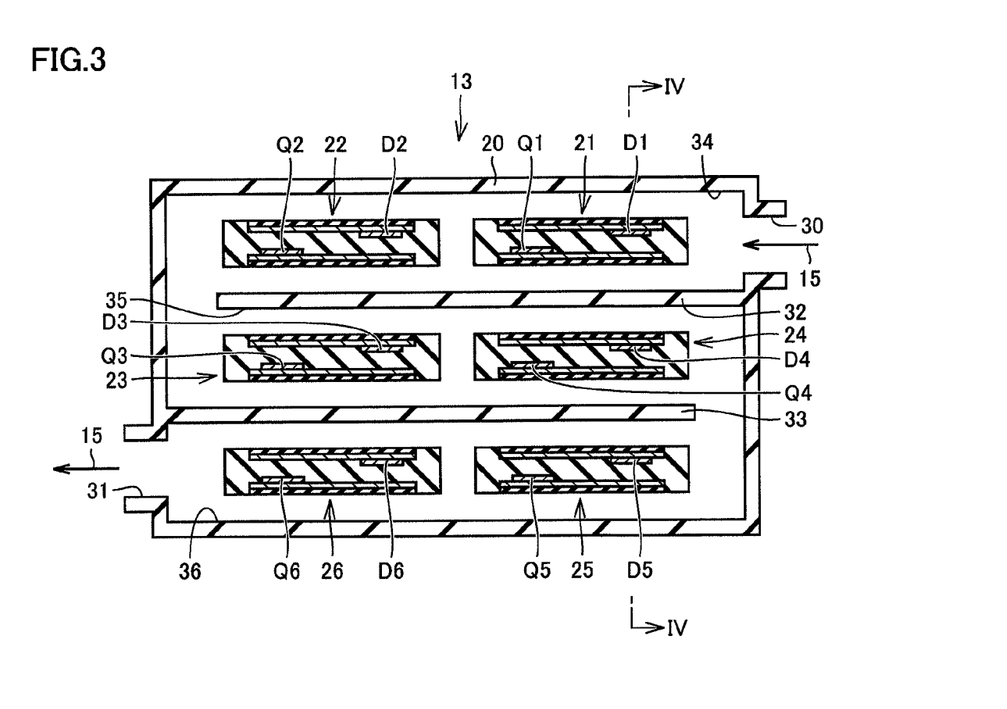
FIG. 3 is a cross-sectional view of a cooling apparatus 13.
Figure 4:
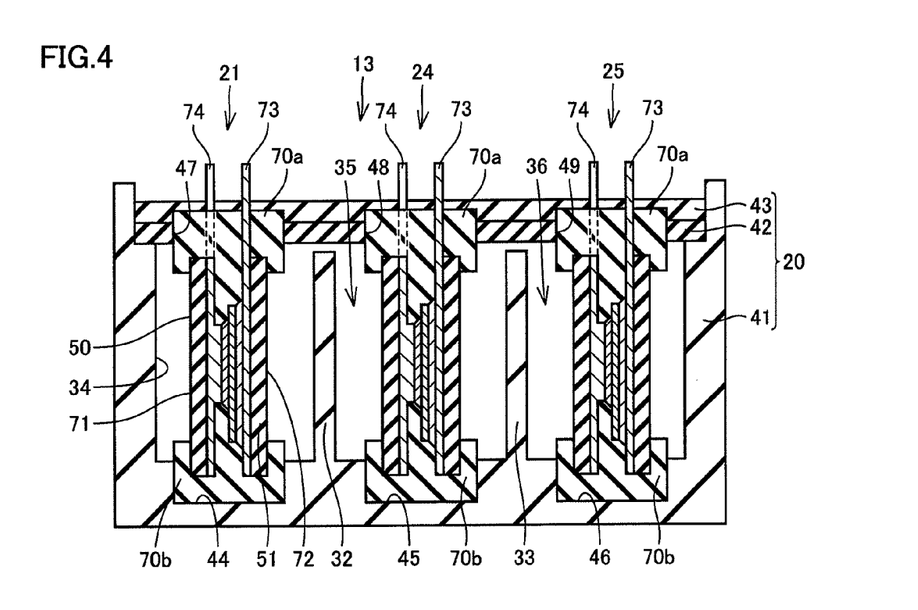
FIG. 4 is a side cross-sectional view of cooling apparatus 13.

FIG. 3 is a cross-sectional view of cooling apparatus 13, and FIG. 4 is a side cross-sectional view of cooling apparatus 13. As shown in FIG. 3, cooling apparatus 13 includes a case 20 in which refrigerant 15 flows, and a plurality of element modules 21, 22, 23, 24, 25, and 26 provided inside case 20.

Case 20 includes a plurality of partition plates 32, 33 disposed at a distance from each other inside case 20, and partition plates 32, 33 form a plurality of refrigerant passages 34, 35, and 36 inside case 20. Refrigerant passages 34, 35, and 36 are connected in series.

A supply port 30 and a discharge port 31 are formed in a peripheral wall portion of case 20, with supply port 30 and refrigerant passage 34 communicating with each other, and discharge port 31 and refrigerant passage 36 communicating with each other. Refrigerant 15 that has entered refrigerant passage 34 through supply port 30 thus flows sequentially through refrigerant passage 34, refrigerant passage 35, and refrigerant passage 36, and discharged through discharge port 31.

Power transistor Q1 and diode D1 are provided inside element module 21. Similarly, power transistors Q2, Q3, Q4, Q5, and Q6 and diodes D2, D3, D4, D5, and D6 are provided inside element modules 22, 23, 24, 25, and 26.

As shown in FIG. 4, case 20 includes a case main body 41 whose upper surface is open, an upper wall portion 42 that covers the opening in case main body 41, and a potting material 43 that paves upper wall portion 42. Each of case main body 41 and upper wall portion 42 is formed of an insulating material, for example. Partition plates 32 and 33 are formed integrally with a bottom surface of case main body 41, and protrude upward from the bottom surface of case main body 41.

Refrigerant passage 36 is formed between a side wall portion of case main body 41 and partition plate 33, and refrigerant passage 35 is formed between partition plates 33 and 32. Refrigerant passage 34 is formed between partition plate 32 and the side wall portion of case main body 41.

Each of refrigerant passages 34, 35, and 36 is filled with refrigerant 15 to an upper end thereof.

A receiving portion 44 that receives a lower end of element module 21 and a receiving portion 47 that receives an upper end of element module 21 are formed in refrigerant passage 34. A receiving portion 45 that receives a lower end of element module 24 and a receiving portion 48 that receives an upper end of element module 24 are formed in refrigerant passage 35. A receiving portion 46 that receives a lower end of element module 25 and a receiving portion 49 that receives an upper end of element module 25 are formed in refrigerant passage 36.

Receiving portions 44, 45, and 46 are formed by providing recesses in the bottom surface of case main body 41, and receiving portions 47, 48, and 49 are through-holes formed in upper wall portion 42. The lower ends of element modules 21, 24, and 25 are fitted into receiving portions 44, 45, and 46, and the upper ends of element modules 21, 24, and 25 are fitted into receiving portions 47, 48, and 49.

Element modules 21, 24, and 25 are positioned with the upper ends of element modules 21, 24, and 25 being fitted into receiving portions 47, 48, and 49, and receiving portions 44, 45, and 46 are formed to be slightly wider than the lower ends of element modules 21, 24, and 25. An electrode wiring protrudes from an upper end surface of each of element modules 21, 24, and 25, and the electrode wiring penetrates potting material 43.

A portion located between the upper end and lower end of each of element modules 21, 24, and 25 is disposed within each of refrigerant passages 34, 35, and 36, and the portion of each of element modules 21, 24, and 25 is in direct contact with refrigerant 15.

By bringing each element module into contact with refrigerant 15 as described above, the cooling efficiency of the element in cooling apparatus 13 is increased.

All of element modules 21 to 26 are substantially identical in structure. The structure of element module 21 is now described as a representative example.

Figure 5:
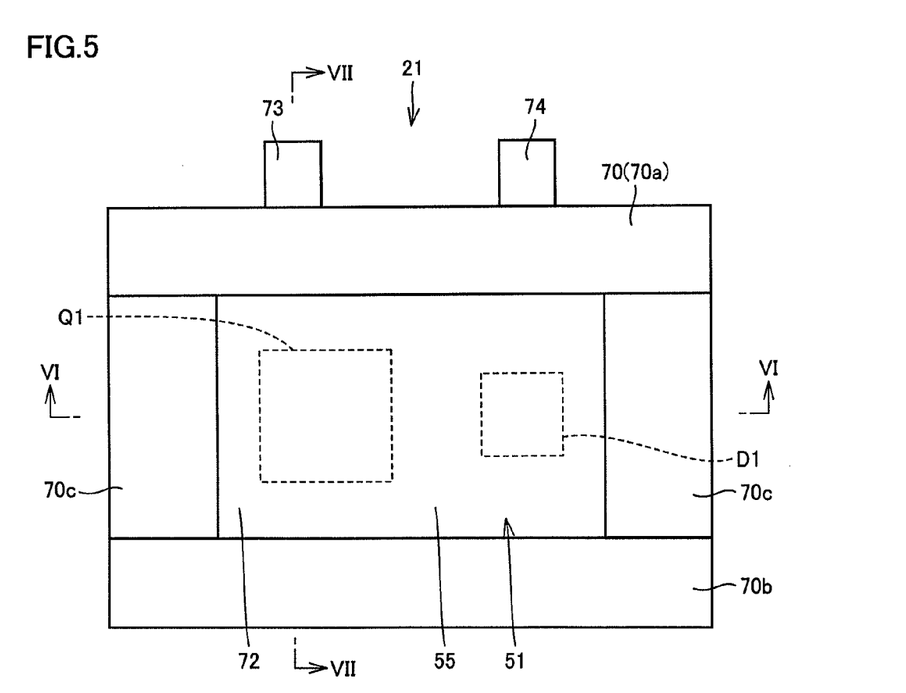
FIG. 5 is a side view of an element module 21.

FIG. 5 is a side view of element module 21, and, as shown in FIGS. 5 and 3, diode D1 and power transistor Q1 are arranged in a direction in which refrigerant 15 circulates. In the example shown in FIG. 5, diode D1 is disposed upstream from power transistor Q1 in the direction in which refrigerant 15 circulates; however, power transistor Q1 may be disposed upstream from diode D1 in the direction in which refrigerant 15 circulates.

Generally, power transistor Q1 generates an amount of heat greater than that generated by diode D1. Power transistor Q1 is therefore disposed upstream in the direction in which refrigerant 15 circulates, so that it can be cooled with refrigerant 15 that has not been warmed by diode D1. This allows power transistor Q1 to be cooled well.

Figure 6:
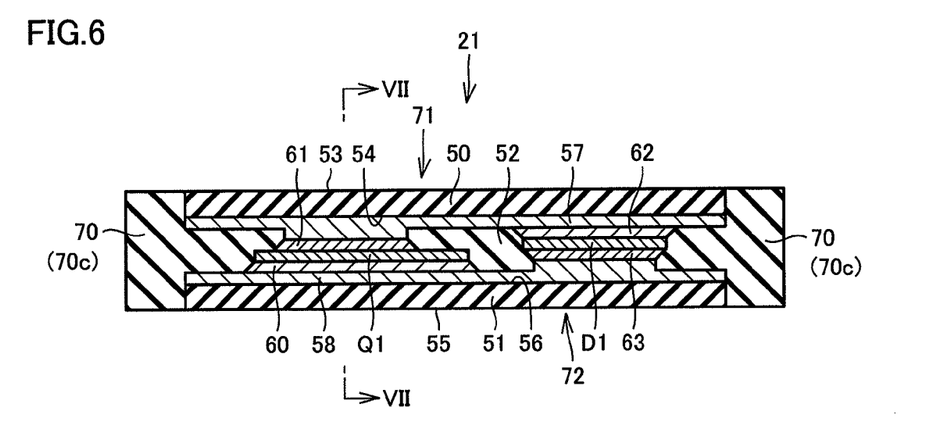
FIG. 6 is a cross-sectional view along line VI-VI in FIG. 5.
Figure 7:
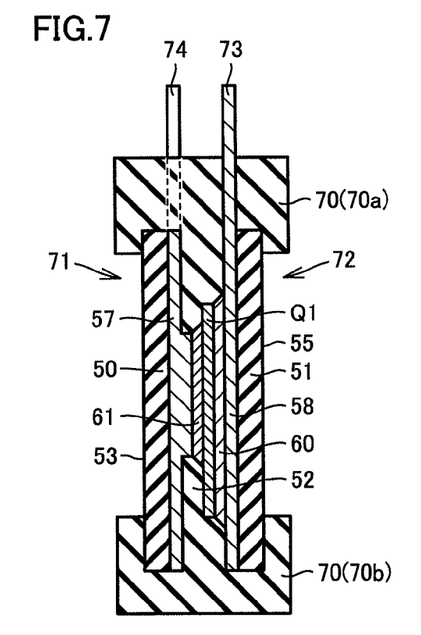
FIG. 7 is a cross-sectional view along line VII-VII in FIG. 5.

FIG. 6 is a cross-sectional view along line VI-VI in FIG. 5, and FIG. 7 is a cross-sectional view along line VII-VII in FIG. 5. In FIG. 6, element module 21 includes an insulating substrate 50 in contact with refrigerant 15, an insulating substrate 51 facing insulating substrate 50 and disposed at a distance from insulating substrate 50, an insulating resin 52 charged between insulating substrates 50 and 51, power transistor Q1 and diode D1, and electrode plates 57, 58.

Insulating substrate 51 and insulating resin 52 are each formed of an insulating material such as a ceramic, alumina (aluminum oxide ($Al_2O_3$)), aluminum nitride (aluminum nitride (AlN)) or the like.

Insulating substrate 50 includes an outer surface 53 and an inner surface 54 facing insulating substrate 51. Outer surface 53 is disposed opposite to insulating substrate 51 with respect to inner surface 54, and a portion of outer surface 53 is in contact with refrigerant 15.

Insulating substrate 51 includes an outer surface 55 and an inner surface 56 facing insulating substrate 50. Outer surface 55 is disposed opposite to insulating substrate 50 with respect to inner surface 56, and a portion of outer surface 55 is in direct contact with refrigerant 15.

Electrode plate 58 is provided on inner surface 56 of insulating substrate 51, and electrode plate 57 is provided on inner surface 54 of insulating substrate 50. As shown in FIG. 7, an electrode wiring 74 is formed on the upper end of electrode plate 57, and an electrode wiring 73 is formed on the upper end of electrode plate 58.

In FIG. 6, power transistor Q1 is fixed to electrode plate 58, and one main surface of power transistor Q1 is fixed to electrode plate 58 by solder 60. The other main surface of power transistor Q1 is fixed to a base of electrode plate 57 by solder 61.

Diode D1 is fixed to electrode plate 57, and one main surface of diode D1 is fixed to electrode plate 57 by solder 62. The other main surface of diode D1 is fixed to a base of electrode plate 58 by solder 63.

Power transistor Q1 and diode D1 are located between insulating substrates 50 and 51, and insulating resin 52 is charged between insulating substrates 50 and 51.

Power transistor Q1 and diode D1 are thus located within insulating resin 52, which prevents contact of power transistor Q1 and diode D1 with refrigerant 15.

Insulating resin 52 is formed of an insulating material, for example, a thermosetting resin such as BMC (Bulk Molding Compound), an epoxy resin, or the like, or an insulating thermoplastic resin such as PPS (Polyphenylene Sulfide), PBT (Polybutylene Terephthalate), or the like.

Referring to FIGS. 6 and 7, insulating resin 52 reaches outer surface 53 of insulating substrate 50 and outer surface 55 of insulating substrate 51 from a portion between insulating substrates 50 and 51, and includes an edge 70 that is formed to cover portions of outer surfaces 53 and 55. Edge 70 is formed with an annular shape along outer peripheral edges of insulating substrates 50 and 51.

Edge 70 includes an upper edge portion 70a formed along upper edge portions of insulating substrates 50, 51, a lower edge portion 70b formed along lower edge portions of insulating substrates 50, 51, and a side edge portion 70c extending along side edge portions of insulating substrates 50, 51.

In FIGS. 7 and 5, upper edge portion 70a and lower edge portion 70b pass between insulating substrates 50 and 51 and along peripheral edge portions of insulating substrates 50, 51 to reach outer surfaces 53, 51. Upper edge portion 70a and lower edge portion 70b are formed to cover portions of outer surfaces 53 and 55. As shown in FIGS. 6 and 5, side edge portion 70c is formed to be flush with outer surfaces 53 and 55. A cooling surface 71 is formed on a portion of outer surface 53 uncovered by edge 70, and a cooling surface 72 is also formed on a portion of outer surface 55 uncovered by edge 70.

As shown in FIG. 4, element modules 21, 24, and 25 are fixed to case 20 with upper edge portions 70a of element modules 21, 24, and 25 being fitted into receiving portions 47, 48, and 49, and with lower edge portions 70b of element modules 21, 24, and 25 being fitted into receiving portions 44, 45, and 46.

An upper surface of upper edge portion 70a is positioned above an upper surface of upper wall portion 42, and positioned outside refrigerant passage 34. Electrode wirings 73, 74 protrude upward from the upper surface of upper edge portion 70a, which prevents contact of electrode wirings 73, 74 with refrigerant 15.

On the other hand, a portion of element module 21 positioned within refrigerant passage 34 and in contact with refrigerant 15 is formed of an insulating material.

Therefore, a refrigerant other than an insulating refrigerant can be adopted as refrigerant 15, for example, an LLC (Long Life Coolant). This also allows cooling circuit 10 shown in FIG. 1 to be incorporated into a cooling circuit generally mounted on a vehicle, thus making equipment mounted on the vehicle more compact.

When element module 21 is seen in a direction in which insulating substrates 50, 51 are arranged, power transistor Q1 and diode D1 are positioned within cooling surface 72 of insulating substrate 51, as shown in FIG. 5. Similarly, when insulating substrate 50 of element module 21 is seen two-dimensionally, power transistor Q1 and diode D1 are positioned within cooling surface 71.

Thus, power transistor Q1 and diode D1 are cooled well by direct contact of refrigerant 15 with cooling surfaces 71 and 72.

Furthermore, the number of components is reduced by fixing element module 21 to case 20 by means of upper edge portion 70a, which is a portion of insulating resin 52.

In cooling apparatus 13 according to the first embodiment, element modules 21, 24, and 25 are positioned with their upper edge portions 70a being fitted into receiving portions 47, 48, and 49. Upper ends of insulating substrates 50, 51 are separated below from receiving portion 47. Thus, even if thermal stress is produced between an inner wall surface of receiving portion 47 and upper edge portion 70a, the application of great thermal stress to insulating substrates 50, 51 is prevented, which prevents damage to insulating substrates 50, 51.

Figure 8:
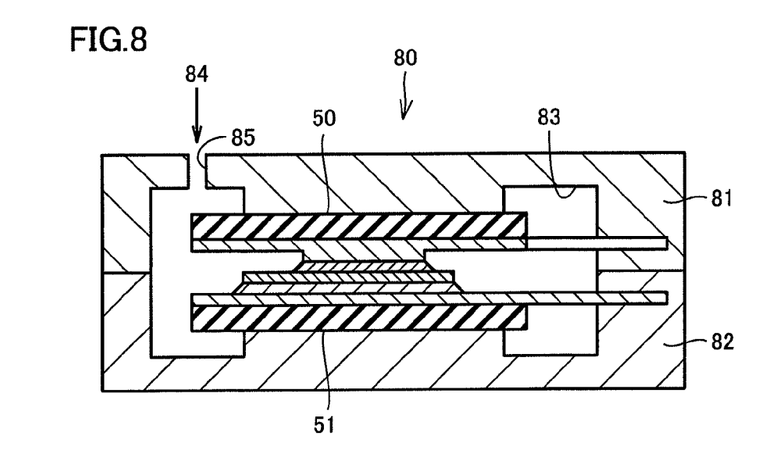
FIG. 8 is a cross-sectional view showing a fabrication step when charging an insulating resin 52 of the element module.

FIG. 8 is a cross-sectional view showing a fabrication step when charging an insulating resin 52 of the element module. As shown in FIG. 8, at the time of charging insulating resin 52, an element module in which insulating resin 52 has not been formed is placed in a resin molding apparatus 80.

Resin molding apparatus 80 includes a mold 81 and a mold 82, which define a cavity 83 within resin molding apparatus 80. A supply port 85, which communicates with cavity 83 and through which resin material 84 is supplied, is formed in mold 81.

Then, at the time of forming insulating resin 52, the element module is placed within cavity 83 first. Insulating substrate 50 of the element module is brought into contact with an inner wall surface of mold 81, and insulating substrate 51 is brought into contact with mold 82.

A portion of the outer surface of insulating substrate 50 in contact with mold 81 is to become cooling surface 71, and a portion of the outer surface of insulating substrate 51 in contact with mold 82 is to become cooling surface 72.

Resin material 84 is charged into cavity 83 while insulating substrates 50, 51 are in contact with the inner wall surfaces of molds 81, 82.

At the time, if a small gap is formed between the inner wall surfaces of molds 81, 80 and the outer surfaces of insulating substrates 50, 51, a small amount of resin will be formed in cooling surfaces 71, 72.

In cooling apparatus 13 according to this embodiment, since refrigerant 15 is brought into contact with substantially the entire surfaces of cooling surfaces 71, 72, even if a thin film of resin is formed in a portion of cooling surfaces 71, 72, the cooling efficiency of power transistor Q1 and diode D1 will show substantially no decrease.

Thus, in the step of forming insulating resin 52, it is not necessary to apply an excessive load on insulating substrates 50, 51, and the load applied to insulating substrates 50, 51 can be kept low.

Consequently, damage to insulating substrates 50, 51 can be prevented during the manufacturing process of the element module, leading to an improved yield.

In FIG. 4, case main body 41 is formed with a box shape that is open upward, and partition plates 32, 33 are formed to extend upward from the bottom surface of case main body 41. Case main body 41 and partition plates 32, 33 can be integrally resin-molded easily by injection molding, which leads to a reduced number of manufacturing steps of cooling apparatus 13.

Second Embodiment

Cooling apparatus 13 according to the second embodiment will be described using FIGS. 9 to 11, and FIG. 3, as needed. Among the components shown in FIGS. 9 to 11, components identical or corresponding to those shown in FIGS. 1 and 8 above may be denoted by identical numerals, and description thereof may not be repeated.

Figure 9:
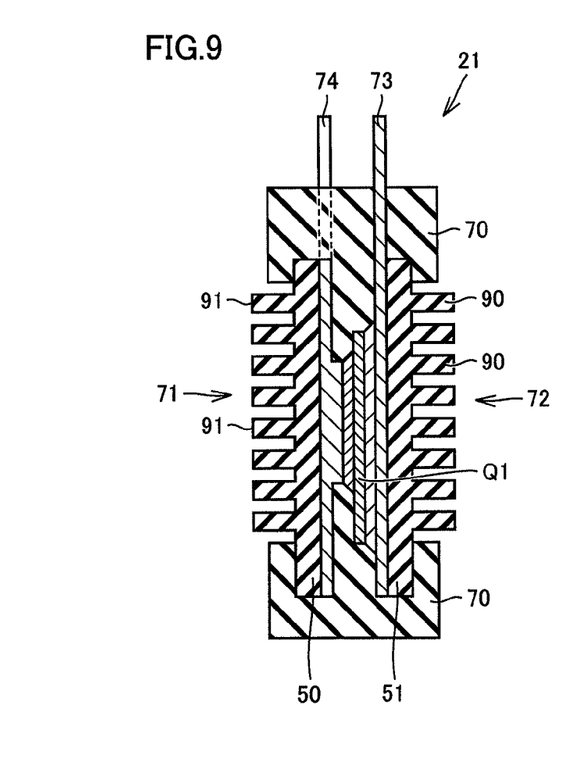
FIG. 9 is a cross-sectional view showing element module 21 mounted on cooling apparatus 13 according to a second embodiment.

FIG. 9 is a cross-sectional view showing element module 21 mounted on cooling apparatus 13 according to the second embodiment. Element module 21 shown in FIG. 9 includes a plurality of cooling fins 91 provided on cooling surface 71 and a plurality of cooling fins 90 provided on cooling surface 72. The plurality of cooling fins 90, 91 are formed in a height direction at a distance from one another.

Figure 10:
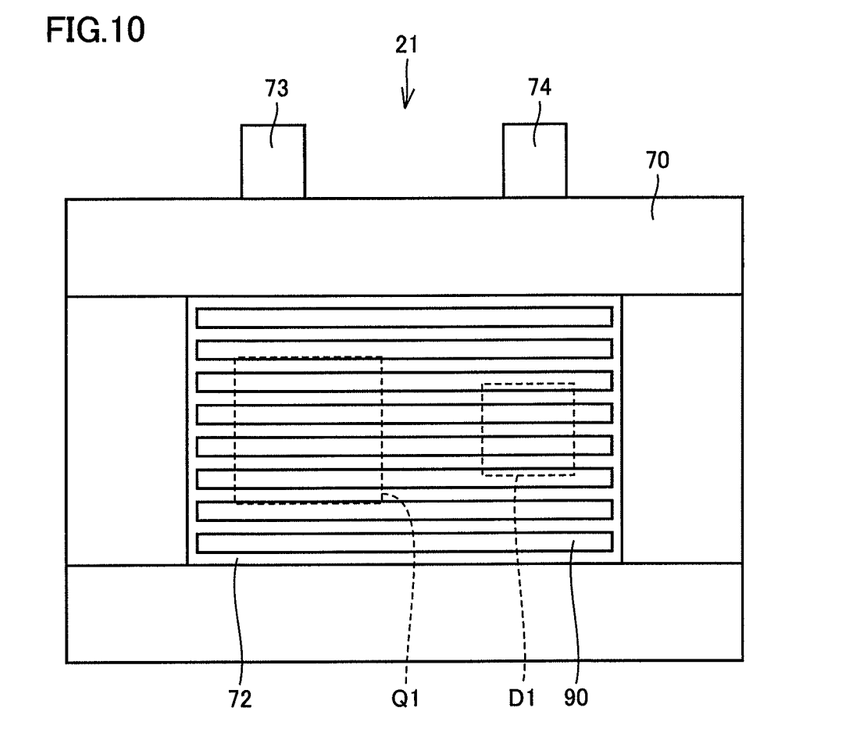
FIG. 10 is a side view of element module 21 shown in FIG. 9.

FIG. 10 is a side view of element module 21 shown in FIG. 9. As shown in FIG. 10, each cooling fin 90 extends in a width direction of element module 21. In other words, each cooling fin 90 extends in the direction in which refrigerant 15 circulates. This prevents resistance to circulation of refrigerant 15 from becoming excessively high due to cooling fin 90. Cooling fin 91 is also formed to extend in the direction in which refrigerant 15 circulates, as with cooling fin 90.

Figure 11:
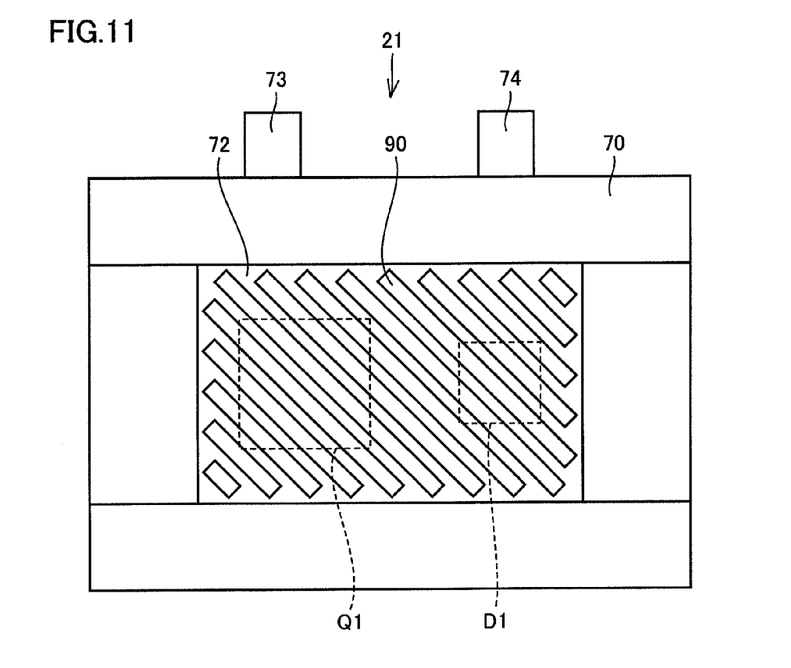
FIG. 11 is a side view of element module 21 showing a modification of a cooling fin 90.

FIG. 11 is a side view of element module 21 showing a modification of cooling fin 90. In the example shown in FIG. 11, each cooling fin 90 is formed to extend in an oblique direction. Each cooling fin 90 is thus disposed to intersect with the direction in which refrigerant 15 circulates, which disturbs the flow of refrigerant 15 to promote creating turbulence while refrigerant 15 flows between cooling fins 90. The efficiency of cooling with refrigerant 15 can be improved by creating turbulence in the flow of refrigerant 15. In the example shown in FIG. 11, cooling fins 91 are formed in the same manner as with cooling fins 90. Cooling fins 90, 91 can thus adopt various shapes.

Third Embodiment

Figure 12:
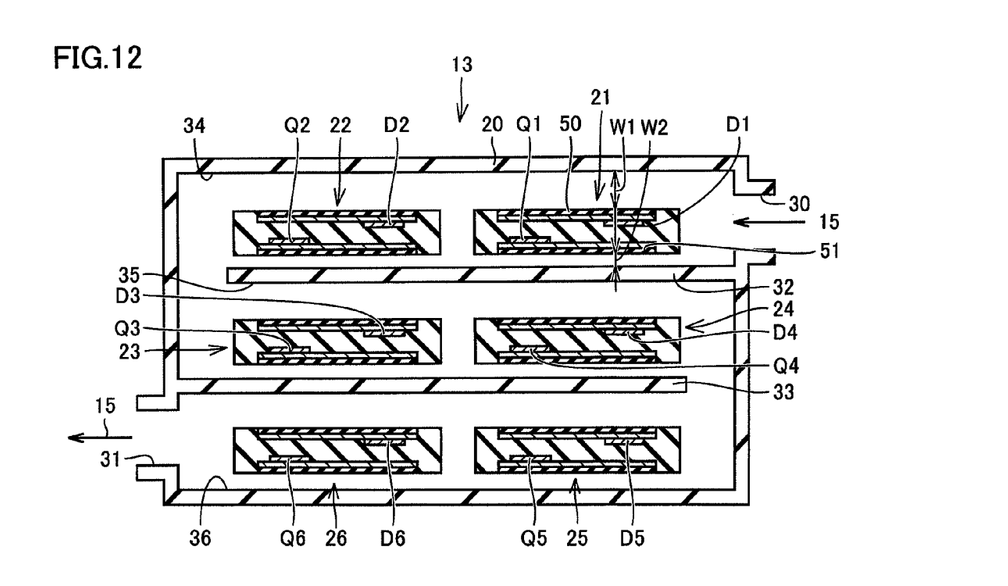
FIG. 12 is a cross-sectional view of cooling apparatus 13 according to a third embodiment.

Cooling apparatus 13 according to a third embodiment will be described using FIG. 12, and FIG. 6 above. FIG. 12 is a cross-sectional view of cooling apparatus 13 according to the third embodiment.

Now referring to FIG. 6, diode D1 is provided in a position closer to inner surface 54 of insulating substrate 50 than inner surface 56 of insulating substrate 51, and power transistor Q1 is provided in a position closer to inner surface 56 of insulating substrate 51 than inner surface 54 of insulating substrate 50.

Turning back to FIG. 12, in the case of element module 21, refrigerant 15 flows between insulating substrate 50 and the inner wall surface of element module 21, and between insulating substrate 51 and partition plate 32.

A flow path width W2 of a flow path formed between the outer surface of insulating substrate 51 and partition plate 32 is smaller than a flow path width W1 of a flow path formed between the outer surface of insulating substrate 50 and the inner wall surface of case 20.

Hence, the flow velocity of refrigerant 15 flowing between insulating substrate 51 and partition plate 32 is higher than that of refrigerant 15 flowing between insulating substrate 50 and the inner wall surface of case 20. This allows power transistor Q1 that generates an amount of heat greater than that generated by diode D1 to be cooled well, which prevents power transistor Q1 from being heated to an elevated temperature.

It is noted that element module 22 is disposed in the same manner as with element module 21, and power transistor Q2 of element module 21 is cooled well.

Element modules 23, 24 are disposed such that a distance between element modules 23, 24 and partition plate 33 is smaller than a distance between element modules 23, 24 and partition plate 32. Hence, the flow velocity of refrigerant 15 flowing between partition plate 33 and element modules 23, 24 is higher than that of refrigerant 15 flowing between partition plate 32 and element modules 23, 24, so that power transistors Q3, Q4 can be cooled well. It is noted that power transistors Q3, Q4 are disposed in positions closer to the insulating substrate facing partition plate 33 than the insulating substrate facing partition plate 32.

Element modules 25, 26 are disposed such that a distance between the inner wall surface of case 20 and element modules 25, 26 is smaller than a distance between element modules 25, 26 and partition plate 33. Hence, the flow velocity of refrigerant 15 flowing between the inner wall surface of case 20 and element modules 25, 26 is higher than that of refrigerant 15 flowing between partition plate 33 and element modules 25, 26.

Since power transistors Q5, Q6 are disposed in positions closer to the inner wall surface of case 20 than partition plate 33, they are cooled well with refrigerant 15 having a higher flow velocity.

Fourth Embodiment

Figure 13:
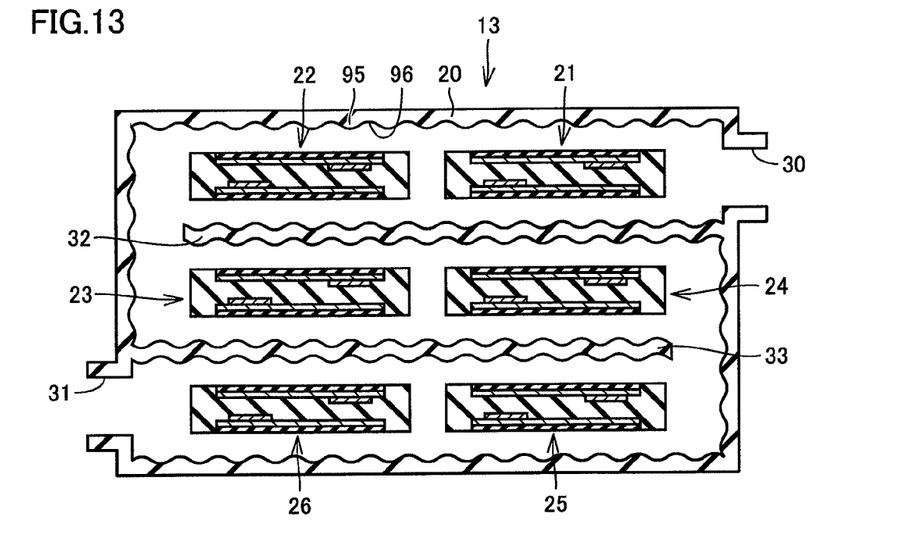
FIG. 13 is a cross-sectional view of cooling apparatus 13 according to a fourth embodiment.

Cooling apparatus 13 according to a fourth embodiment will be described using FIG. 13. FIG. 13 is a cross-sectional view of cooling apparatus 13 according to the fourth embodiment.

As shown in FIG. 13, a plurality of projections 95 and depressions 96 are formed on an inner surface of case 20, a surface of partition plate 32, and a surface of partition plate 33.

The formation of the plurality of projections 95 and depressions 96 on inner surfaces of refrigerant passages 34, 35, 36 allows turbulence to be created in the flow of refrigerant 15 flowing in refrigerant passages 34, 35, 36. Each of the elements is thus cooled well. While the example shown in FIG. 13 describes the case where the plurality of projections and depressions are formed, depressions or projections may also be formed alone.

Fifth Embodiment

Cooling apparatus 13 according to a fifth embodiment will be described using FIGS. 14 and 15.

Figure 14:
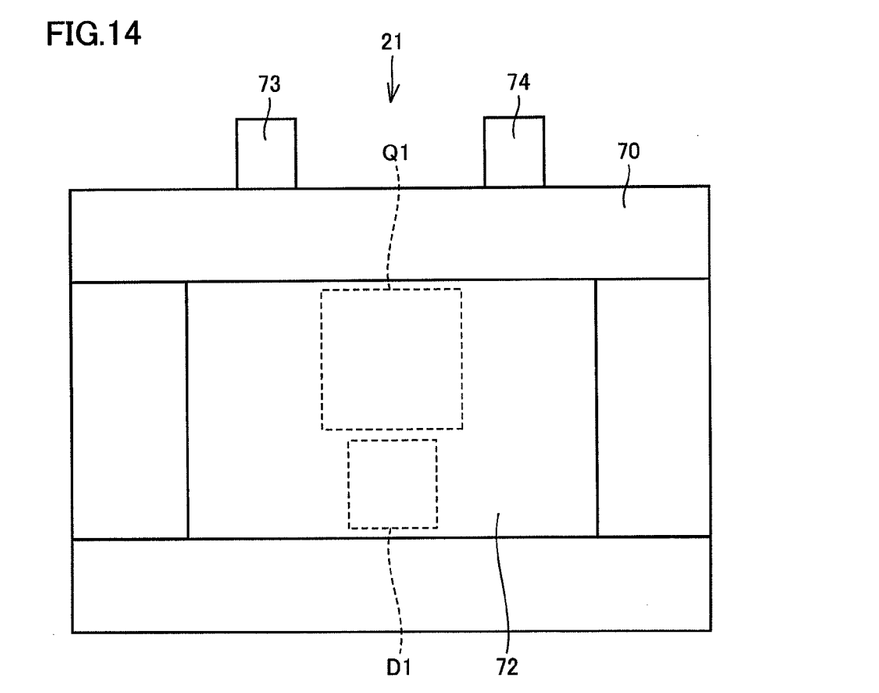
FIG. 14 is a side view showing element module 21 mounted on cooling apparatus 13 according to a fifth embodiment.

FIG. 14 is a side view showing element module 21 mounted on cooling apparatus 13 according to the fifth embodiment. As shown in FIG. 14, power transistor Q1 and diode D1 are arranged in a height direction of element module 21. In the example shown in FIG. 14, power transistor Q1 is disposed above diode D1.

Figure 15:
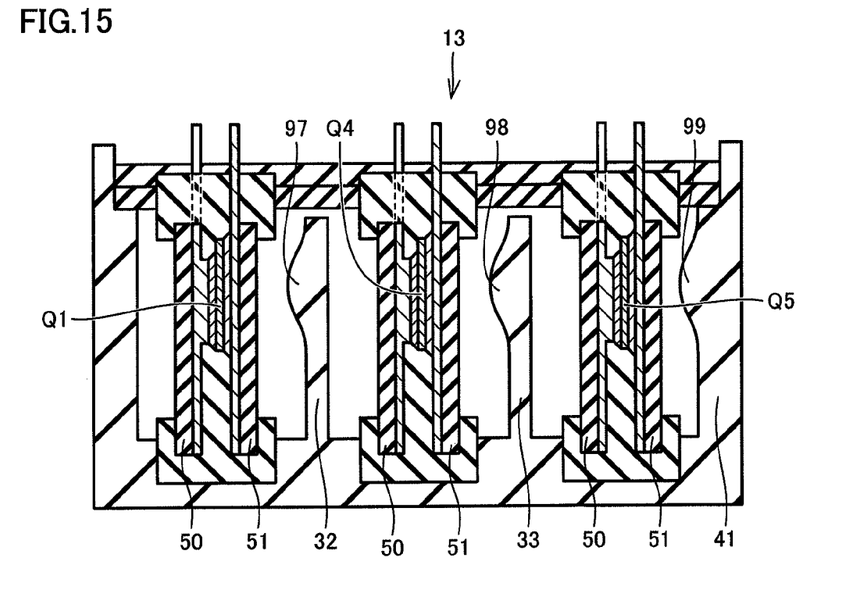
FIG. 15 is a cross-sectional view of cooling apparatus 13 according to the fifth embodiment.

FIG. 15 is a cross-sectional view of cooling apparatus 13 according to the fifth embodiment. In FIG. 15, insulating substrate 51 of element module 21 is disposed to face partition plate 32, and insulating substrate 50 is disposed to face the inner wall surface of case main body 41.

Similarly, insulating substrate 51 of element module 24 is disposed to face partition plate 33, and insulating substrate 50 of element module 21 is disposed to face partition plate 32.

Insulating substrate 50 of element module 25 is disposed to face the inner wall surface of case main body 41, and insulating substrate 51 of element module 25 is disposed to face partition plate 33.

Power transistors Q1, Q4, and Q5 are disposed nearer to insulating substrate 51 than insulating substrate 50.

A bulging portion 97 that protrudes toward element module 21 is formed in a portion of partition plate 32 facing power transistor Q1 of element module 21. A bulging portion 98 that protrudes toward element module 24 is formed in a portion of partition plate 33 facing power transistor Q4 of element module 24. A bulging portion 99 that protrudes toward element module 25 is formed in a portion of the inner wall surface of case 20 facing power transistor Q5 of element module 25.

Hence, the flow velocity of refrigerant 15 flowing between bulging portions 97, 98, and 99 and element modules 21, 23, and 25 is higher than that of refrigerant 15 flowing in other portions of refrigerant passages 34, 35, and 36. Consequently, power transistors Q1, Q4, and Q5 can be cooled well.

While the foregoing first to fifth embodiments have described the cooling apparatus for inverter 120 shown in FIG. 1, needless to say, the present invention can also be applied to a cooling apparatus for inverter 130 or a cooling apparatus that cools converter 110. Alternatively, the elements of inverters 120, 130, and converter 110 may be cooled with a single cooling apparatus.

Figure 16:
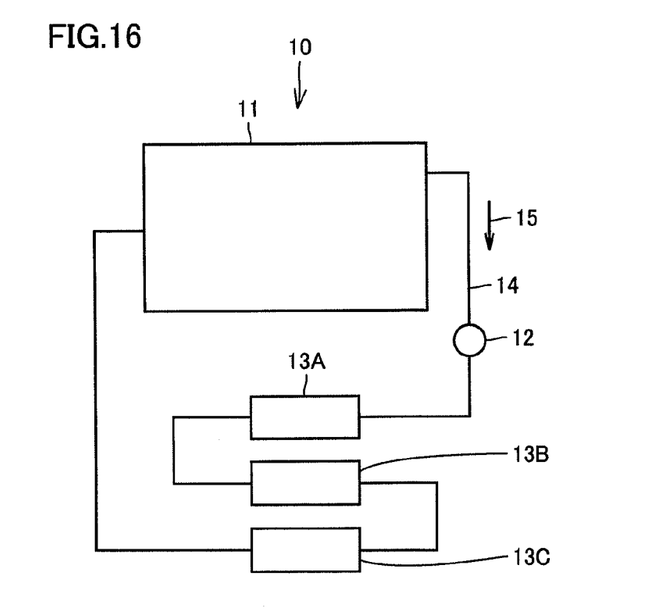
FIG. 16 is a circuit diagram showing a modification of cooling circuit 10.

Furthermore, when the cooling apparatus that cools inverter 120, the cooling apparatus that cools inverter 130, and the cooling apparatus that cools converter 110 are connected to one another, they are connected in series in the direction in which refrigerant 15 circulates. Specifically, as shown in FIG. 16, cooling circuit 10 includes a cooling apparatus 13A that cools the elements of inverter 120, a cooling apparatus 13B that cools the elements of inverter 130, and a cooling apparatus 13C that cools the elements of converter 110. Refrigerant pipe 14 connects cooling apparatus 13A, cooling apparatus 13B, and cooling apparatus 13C in series.

While embodiments of the present invention have been described as above, it should be understood that the embodiments disclosed herein are illustrative and non-restrictive in every respect. The scope of the present invention is defined by the terms of the claims, and is intended to include any modifications within the scope and meaning equivalent to the terms of the claims.

INDUSTRIAL APPLICABILITY

The present invention can be applied to cooling apparatuses that cool elements.

REFERENCE SIGNS LIST

10: cooling circuit; 11: heat exchanger; 12: pump; 13, 13A, 13B, 13C: cooling apparatus; 14: refrigerant pipe; 15: refrigerant; 20: case; 21, 22, 23, 24, 25, 26: element module; 30, 85: supply port; 31: discharge port; 32, 33: partition plate; 34, 35, 36: refrigerant passage; 35: refrigerant passage; 41: case main body; 42: upper wall portion; 43: potting material; 44, 45, 46, 47, 48, 49: receiving portion; 50, 51, 50: insulating substrate; 51, 53, 55: outer surface; 54, 56: inner surface; 57, 58: electrode plate; 60, 61, 62, 63: solder; 70: edge; 70a: upper edge portion; 70b: lower edge portion; 70c: side edge portion; 71, 72: cooling surface; 73, 74: electrode wiring; 81, 82: mold; 83: cavity; 84: resin material; 90, 91: cooling fin; 95: projection; 96: depression; 97, 97, 98, 99: bulging portion; 110: converter; 120, 130: inverter; Q1, Q2, Q3, Q4, Q5, Q5, Q6: power transistor; W1, W2: flow path width

The invention claimed is:

1. A cooling apparatus comprising:
a case in which a refrigerant passage through which a refrigerant flows is formed; and
an element module partially disposed within said refrigerant passage and including an element provided inside,
a portion of said element module in contact with said refrigerant being formed of an insulating material,
said element including
a first unit element and
a second unit element that generates an amount of heat greater than that generated by said first unit element, and
a distance between said second unit element and an inner wall surface of said refrigerant passage being smaller than a distance between said first unit element and the inner wall surface of said refrigerant passage.

2. The cooling apparatus according to claim 1, wherein said element module includes
a first insulating substrate in contact with said refrigerant,
a second insulating substrate facing said first insulating substrate and disposed at a distance from said first insulating substrate, and being in contact with said refrigerant, and
a resin portion charged between said first insulating substrate and said second insulating substrate and formed of an insulating material, and
said element is provided between said first insulating substrate and said second insulating substrate, and disposed within said resin portion.

3. The cooling apparatus according to claim 2, wherein said first insulating substrate includes
a first inner surface facing said second insulating substrate, and
a first outer surface positioned opposite to said second insulating substrate with respect to said first inner surface,
said second insulating substrate includes
a second inner surface facing said first insulating substrate, and
a second outer surface positioned opposite to said first insulating substrate with respect to said second inner surface,
said resin portion reaches said first outer surface and said second outer surface from a portion between said first insulating substrate and said second insulating substrate, and is formed to cover a portion of said second outer surface,
a first cooling surface uncovered by said resin portion and in contact with said refrigerant is formed on said first outer surface,
a second cooling surface uncovered by said resin portion and in contact with said refrigerant is formed on said second outer surface, and
when said first insulating substrate, said second insulating substrate, and said element are seen in a direction in which said first insulating substrate and said second insulating substrate are arranged, said element is disposed within said first cooling surface and said second cooling surface.

4. The cooling apparatus according to claim 3, wherein said resin portion is formed from the portion between said first insulating substrate and said second insulating substrate toward portions of said first outer surface and said second outer surface, and is formed to cover the portions of said first outer surface and said second outer surface, and includes an edge extending along outer peripheries of said first insulating substrate and said second insulating substrate,
said first cooling surface is formed on a portion of said first outer surface uncovered by said edge, and said second cooling surface is formed on a portion of said second outer surface uncovered by said edge, and
a receiving portion that receives a portion of said edge is formed on an inner surface of said refrigerant passage.

5. The cooling apparatus according to claim 3, wherein said first insulating substrate includes a plurality of first cooling fins protruding from said first cooling surface, and
said second insulating substrate includes a plurality of second cooling fins protruding from said second cooling surface.

6. The cooling apparatus according to claim 2, wherein said first insulating substrate and said second insulating substrate are formed of a ceramic.

7. The cooling apparatus according to claim 2, wherein said first insulating substrate includes
a first inner surface facing said second insulating substrate, and
a first outer surface positioned opposite to said second insulating substrate with respect to said first inner surface,
said second insulating substrate includes
a second inner surface facing said first insulating substrate, and
a second outer surface positioned opposite to said first insulating substrate with respect to said second inner surface,
said first unit element is provided in a position closer to said first inner surface than said second inner surface, and
said second unit element is provided in a position closer to said second inner surface than said first inner surface, and
a distance between said second outer surface and an inner wall surface of said refrigerant passage is smaller than a distance between said first outer surface and the inner wall surface of said refrigerant passage.

8. The cooling apparatus according to claim 1, wherein at least one of a plurality of depressions or a plurality of projections are formed on an inner surface of said refrigerant passage.

9. The cooling apparatus according to claim 1, wherein said case is integrally formed by resin molding.

* * * * *